(12) United States Patent
Fontacha et al.

(10) Patent No.: US 6,465,745 B1
(45) Date of Patent: Oct. 15, 2002

(54) MICRO-BGA BEAM LEAD CONNECTION

(75) Inventors: Edwin R. Fontacha, San Jose; Viswanath Valluri, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/661,037

(22) Filed: Sep. 13, 2000

Related U.S. Application Data

(60) Provisional application No. 60/214,457, filed on Jun. 28, 2000.

(51) Int. Cl.[7] .................................................. H05K 1/16
(52) U.S. Cl. ........................ 174/260; 361/777; 361/774
(58) Field of Search ................................. 361/792, 793, 361/794, 795, 777, 779, 780, 774; 257/735; 174/260

(56) References Cited

U.S. PATENT DOCUMENTS

| | | | | |
|---|---|---|---|---|
| 1,718,993 A | * | 7/1929 | Wermine | |
| 3,484,534 A | * | 12/1969 | Kilby et al. | |
| 5,375,041 A | * | 12/1994 | McMahon | ................. 361/749 |

* cited by examiner

*Primary Examiner*—Kamand Cuneo

(57) ABSTRACT

A semiconductor package is provided including a die bearing a plurality of bonding pads and a substrate connected to the die by a connecting agent, the substrate including a plurality of conductive traces forming a wiring pattern, a plurality of vias forming a matrix, and an opening at a position corresponding to the plurality of bonding pads. A plurality of conductive elements fill the vias and at least one trace electrically connected to a conductively filled via disposed adjacent a first side of the tape window is routed to a second side of the tape window to form a beam lead projecting into the tape window from the second side. The beam lead is electrically connected to one of the bonding pads.

17 Claims, 5 Drawing Sheets

MICRO-BGA BEAM LEAD CONNECTION

RELATED APPLICATIONS

This application claims priority from U.S. Provisional Application Ser. No. 60/214,457, filed Jun. 28, 2000, incorporated herein by reference.

FIELD OF THE INVENTION

The present invention relates to integrated circuit packages, and more particularly to an integrated circuit package having beam leads approaching a bonding pad from an outer periphery of the die area.

BACKGROUND ART

Semiconductor chips or wafers are used in applications including integrated circuits (ICs) or flash memory, which may be used in portable electronic devices. It is desirable that a semiconductor chip hold as many circuits or memory cells as possible per unit area to minimize the size, weight, and energy consumption of devices using the semiconductor chips. ICs, whether individual active devices, individual passive devices, multiple active devices within a single chip, or multiple active and passive devices within a single chip, require suitable input/output (I/O) connections between themselves and other circuit elements or structures. These semiconductor devices are typically small and fragile and commonly carried on substrates or carrier members for support. These devices are also frequently encapsulated to protect the device from unfavorable environments, such as dust, mechanical or electrical loads, and moisture.

As the density of semiconductor chip integrated circuits increases, the density of I/O terminals, such as contacts and leads must also increase through, for example, smaller contacts and leads and/or different I/O configurations. Chip-scale packages (CSPs) offer one advantageously compact geometry, typically providing a package having an area less than approximately 1.5 times the size of the die 10 and a perimeter size roughly between 1.0 and 1.2 times the size of the die 10. CSPs find particular applicability in portable devices such as pagers, camcorders, cell phones, cameras, personal information managers, laptop computers, and global positioning devices, where size and weight are important considerations. Of these chip-scale packages, one increasingly important high density I/O configuration is a micro-ball grid array ($\mu$BGA) package. FIGS. 1 and 2 illustrate a chip-scale $\mu$BGA package.

FIG. 1 shows a cross-section of the $\mu$BGA package including a die 10, an elastomer or epoxy-based thermoset adhesive 20 applied to a lower surface of die 10, and a tape or sheet-like interposer 30, such as an insulating organic film of polyimide. The tape 30 has an adhesive 25 formed on one side and also has metal traces or wirings 40 formed thereon or embedded therein. The metal traces 40 may be formed, for example, by depositing a thin metallic film on the tape 30 and wet-etching the metallic film. At one end, each of the metal traces 40 is attached to a respective die bonding pad 60. The traces 40 are routed across tape 30, as shown in FIG. 2, to terminate in a conductive land 45. The lands 45 collectively form a matrix pattern and vias or holes 50 are formed in the tape 30 to overlie these lands 45. As shown in FIG. 1, conductive balls 65 such as solder balls are formed in vias 50 to contact lands 45 and permit electrical connection of the I/O terminals or bonding pads 60 of the die 10 to corresponding bonding pads disposed on the surface of a printed circuit board (PCB) or other substrate. The pitch, a distance from a center line of one ball to a center line of an adjacent ball, is designated by P. An encapsulant 80, such as an epoxy thermoset, is provided to protect the electrical connections from damage caused by unfavorable environments, such as described above.

As shown in FIG. 2, tape windows 70 are selectively formed at either end of die 10 in areas corresponding to the die I/O bonding pads 60. Subsequent to connection of tape 30 to die 10, traces 40 are connected to bonding pads 60. One approach to connecting trace 40 and bonding pad 60 is "wire bonding", wherein a separate wire is used to connect a bonding pad provided at an end portion of trace 40 to bonding pad 60. The separate wire is bonded to each of the bonding pads by bonding means including ultrasonic bonding, thermal bonding, and compression bonding. Another approach to connection of traces 40 and bonding pads 60 which is better suited for the particular design constraints of $\mu$BGA and limitations of conventional manufacturing equipment is a "beam lead" connection illustrated by FIGS. 1 and 2. The beam lead connection is achieved by forming a portion 55 of each trace 40 to project into tape window 50 and overlie a position to be occupied by a bonding pad 60. When a die 10 is disposed in a die receiving area of tape 30, the bonding pads 60 are exposed within the tape window 50 and are displaced (e.g., vertically) from a projecting portion 55 of a corresponding trace 40. The projecting portion 55 is mechanically deformed (e.g., vertically) to contact a bonding pad 60, where it is bonded to the bonding pad 60 by conventional bonding techniques and tools, such as an ultrasonic wedge bonder or thermode, to form a beam lead connection.

However, despite its advantages, $\mu$BGA packaging is not as robust as conventional packaging and die evolution to increasingly smaller die sizes, particularly to CSPs, imposes additional constraints on design, manufacture and reliability of the die packaging. One important parameter is the bending profile of the beam lead, the exposed portion of the trace 40 extending into the tape window 70 to contact the die 10 bonding pad 60. If the bending profile, such as the radius of curvature of the points of beam inflection, is too severe hairline cracks may develop and lead to device failure. Conventionally, to ensure that the beam lead bending profile is maintained, a predetermined tape window 70 size or width is kept constant. Another important parameter is the length of the trace 40 between the ball and the beam lead. If the trace length is too short, difficulties in formation of the short trace adversely affect the reliability of the trace, potentially leading to circuit failure. Another important parameter is ball matrix spacing or pitch. As dies 10 evolve and shrink, the available real estate for chip-scale placement of the ball matrix also shrinks, forcing a decrease in ball matrix pitches, a distance from a center line of one ball to a center line of an adjacent ball. Presently, ball matrix pitch is maintained between about 0.40 to 0.80 mm, although it is difficult to process a 0.40 to 0.50 mm pitch economically using conventional technology. If the ball matrix itch is decreased, the available space between balls is diminished and adversely affects routing of traces between the balls, as can be understood from FIG. 2. However, this approach advantageously preserves a desired trace length between the balls and the beam leads. Alternatively, the pitch may be maintained and the geometry or placement of the balls may instead be redistributed to utilize the available area. Disadvantageously, this alteration in the matrix geometry adversely affects tape window size and beam profile or affects the desired trace length between the balls adjacent the window and the beam leads, each potentially affecting device reliability.

SUMMARY OF INVENTION

Accordingly, a need exists in the art for an improved ball grid array package that permits improved ball matrix geometry while avoiding reliability concerns inherent in solutions affecting the aforementioned desired trace length, beam lead profile and tape window size.

This and other needs are met by the invention which provides, in one aspect, a tape automated bonding (TAB) tape carrier including an insulating tape having a die receiving section and a tape window formed in a portion of the tape die receiving section corresponding to a location of a die bonding pad. The tape carrier includes a conductive wiring pattern having a plurality of traces and a matrix of conductively filled vias electrically connecting a conductor filling the vias with predetermined traces of the conductive wiring pattern. At least one trace electrically connected to a conductively filled via disposed adjacent a first side of the tape window is routed to a second side of the tape window to form a beam lead projecting into the tape window from the second side.

Another aspect of the invention is a semiconductor package including a die bearing a plurality of bonding pads and a substrate connected to the die by a connecting agent, wherein the substrate includes a plurality of conductive traces forming a wiring pattern, a plurality of vias forming a matrix, and an opening at a position corresponding to the plurality of bonding pads. A plurality of conductive elements fill the vias and at least one trace electrically connected to a conductively filled via disposed adjacent a first side of the tape window is routed to a second side of the tape window to form a beam lead projecting into the tape window from the second side. The beam lead is electrically connected to one of the bonding pads.

Still another aspect of the invention includes a method for manufacturing a semiconductor package including providing a die bearing a plurality of bonding pads and providing an insulating tape including a die receiving section, a tape window formed in a portion of the die receiving section corresponding to a location of a die bonding pad, a conductive wiring pattern including a plurality of traces disposed on a side of the tape to be disposed toward the die, and a plurality of vias formed in a matrix pattern, at least one of the traces adjacent a via disposed adjacent a first side of the tape window being routed to one of a second side of the tape window to form a beam lead projecting into the tape window from the second side. In this method, the die and the insulating tape are placed adjacent one another to juxtapose the tape widow and the bonding pads and the die and the insulating tape are connected. The beam lead projecting into the tape window from the respective second side is then electrically connected to a respective bonding pad.

Additional features and advantages of the invention will become readily apparent to those skilled in the art from the following detailed description, wherein only several embodiments or applications of the invention are shown and described, simply by way of illustration of best modes contemplated for carrying out the invention. As will be realized the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
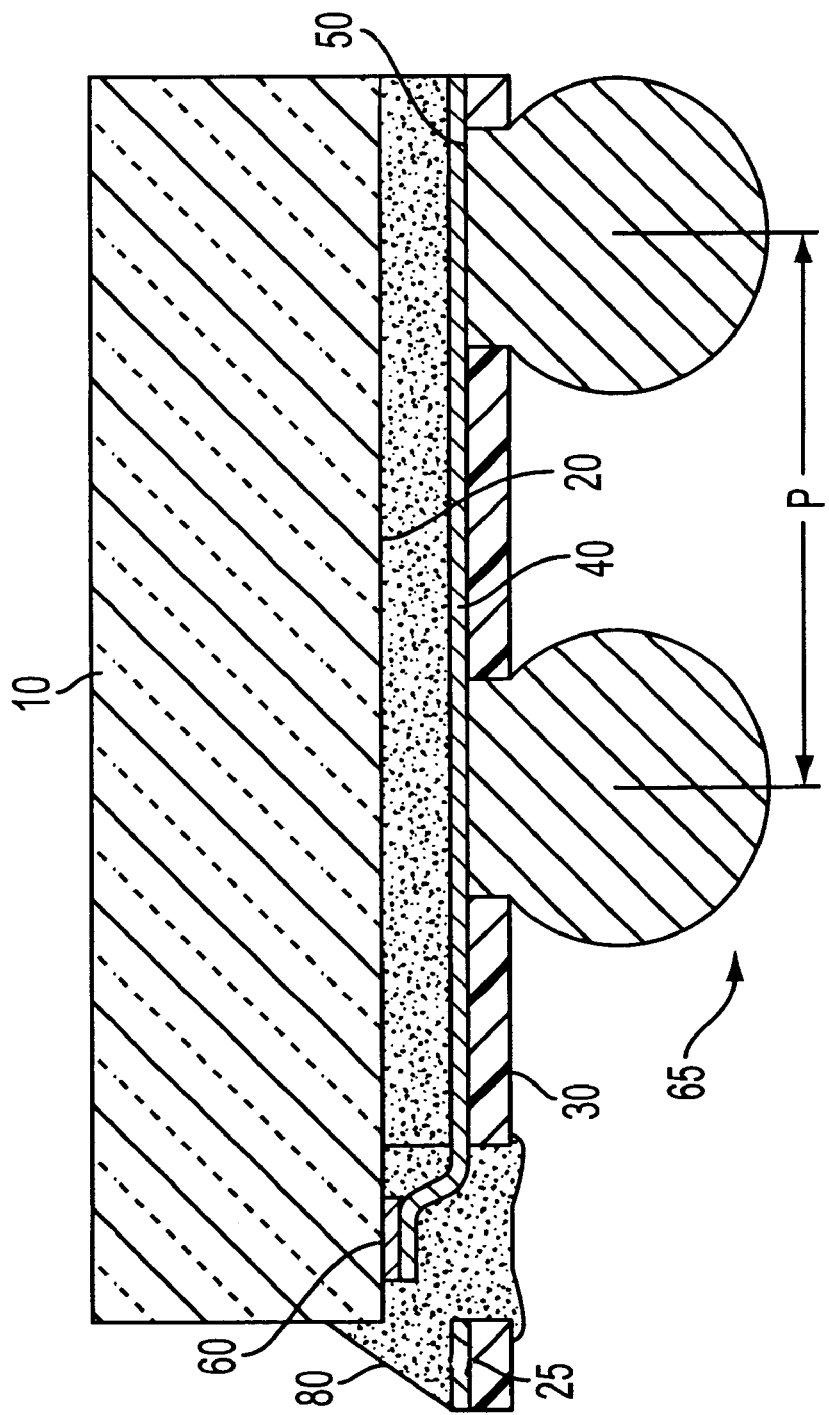
FIG. 1 is a side view of a micro-ball grid array ($\mu$BGA) package.
Figure 2:
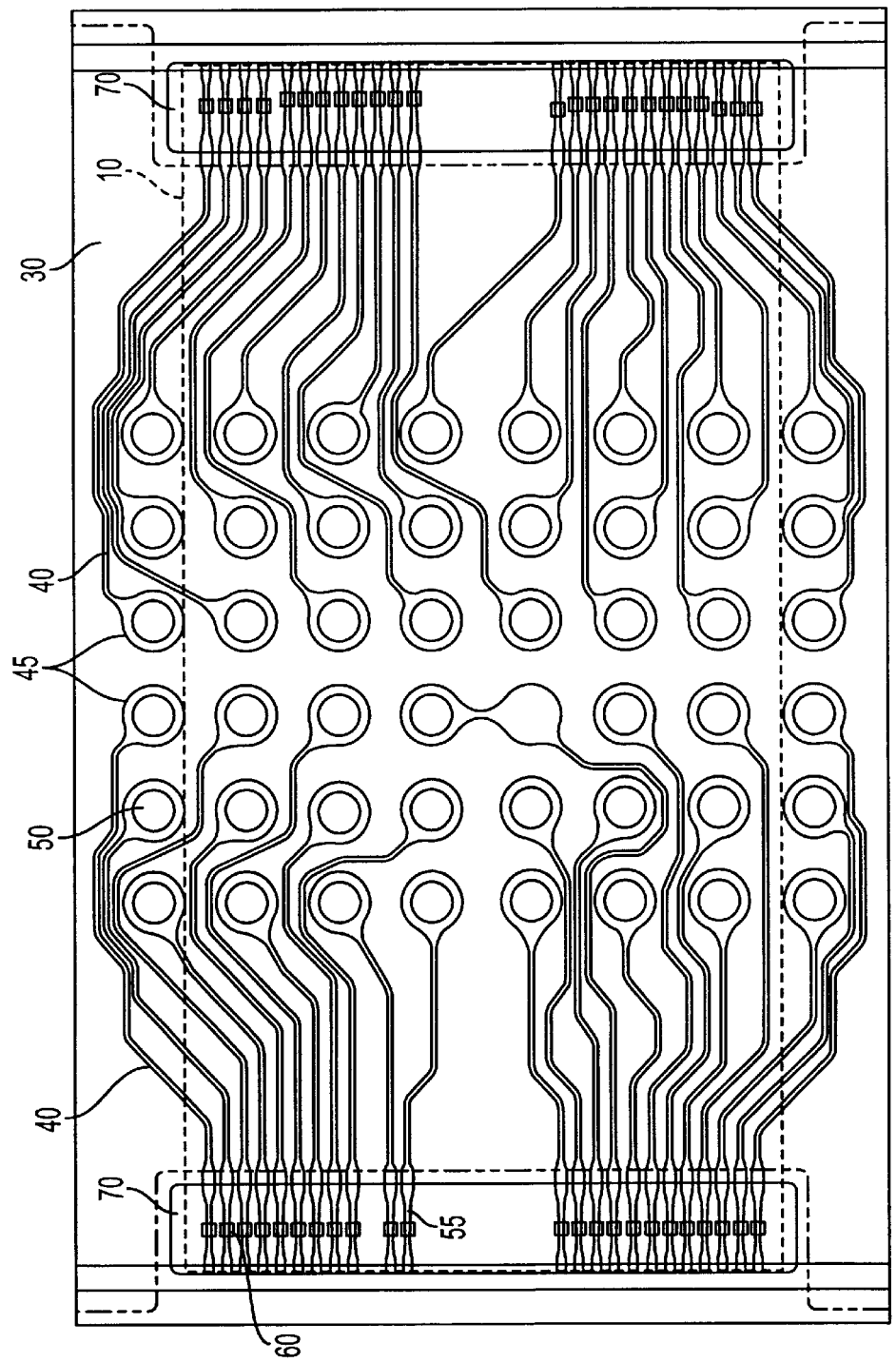
FIG. 2 is a top view of a micro-ball grid array ($\mu$BGA) package.

The present invention addresses and solves problems related to $\mu$BGA reliability concerns stemming from disadvantageous bending profiles of the beam leads and inadequate trace length between the $\mu$BGA ball conductor (e.g., solder ball) and the beam lead forced, in part, by the increasing evolution of dies to smaller and smaller sizes. This decrease in the available space for ball placement imposes design constraints on the placement and spacing of the balls and wiring traces. Conventionally, efforts to overcome these problems have focused on maintaining the trace wiring scheme and acceptable beam lead bending profiles illustrated in FIGS. 1 and 2 and have required implementing reductions in ball pitch, which can be costly and can require specialized tools. The present invention overcomes the undesirable cost associated with this conventional approach through an apparatus and method utilizing conventional equipment and technology.

Figure 3:
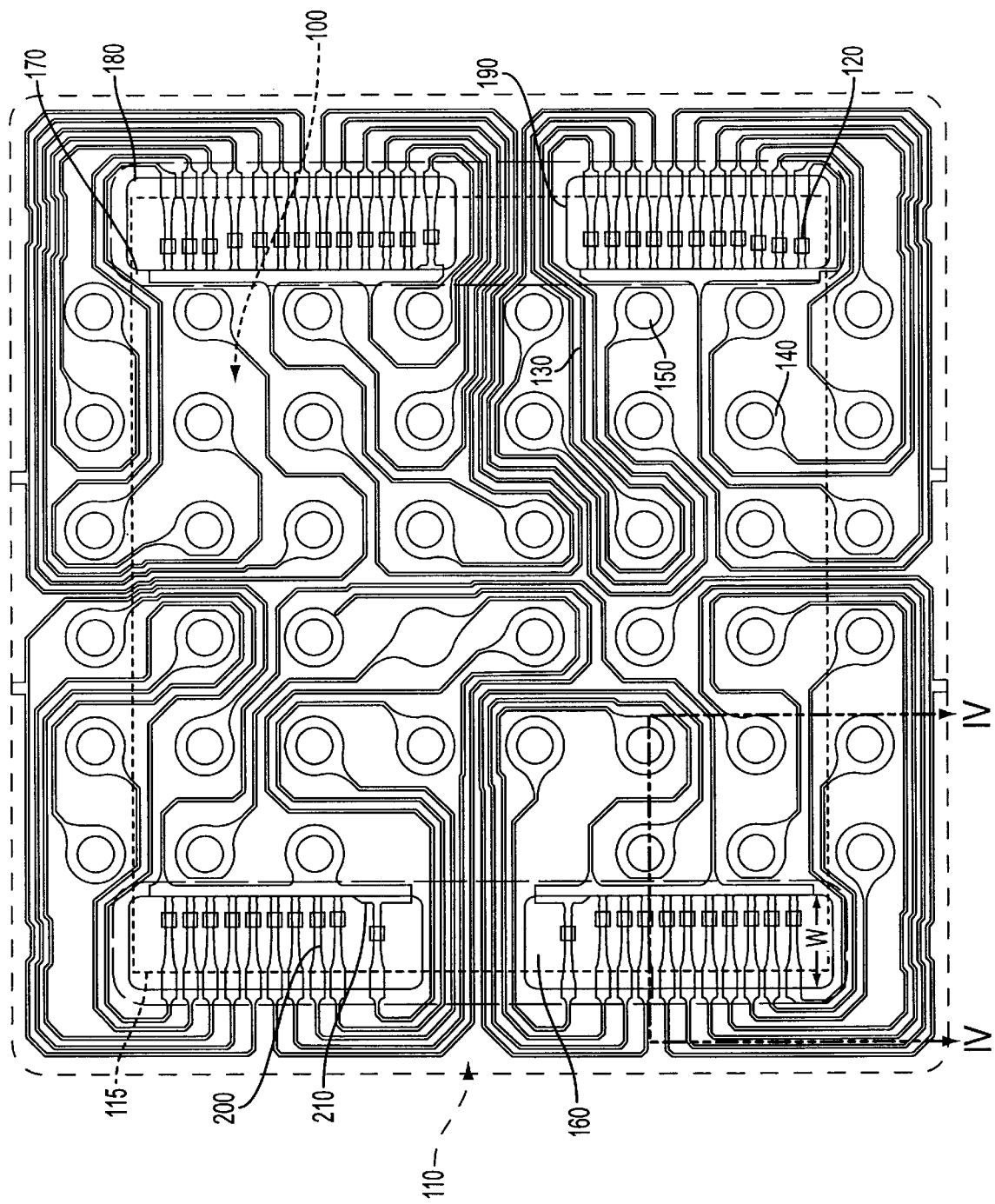
FIG. 3 is a top view of a micro-ball grid array ($\mu$BGA) package according to the invention.
Figure 4:
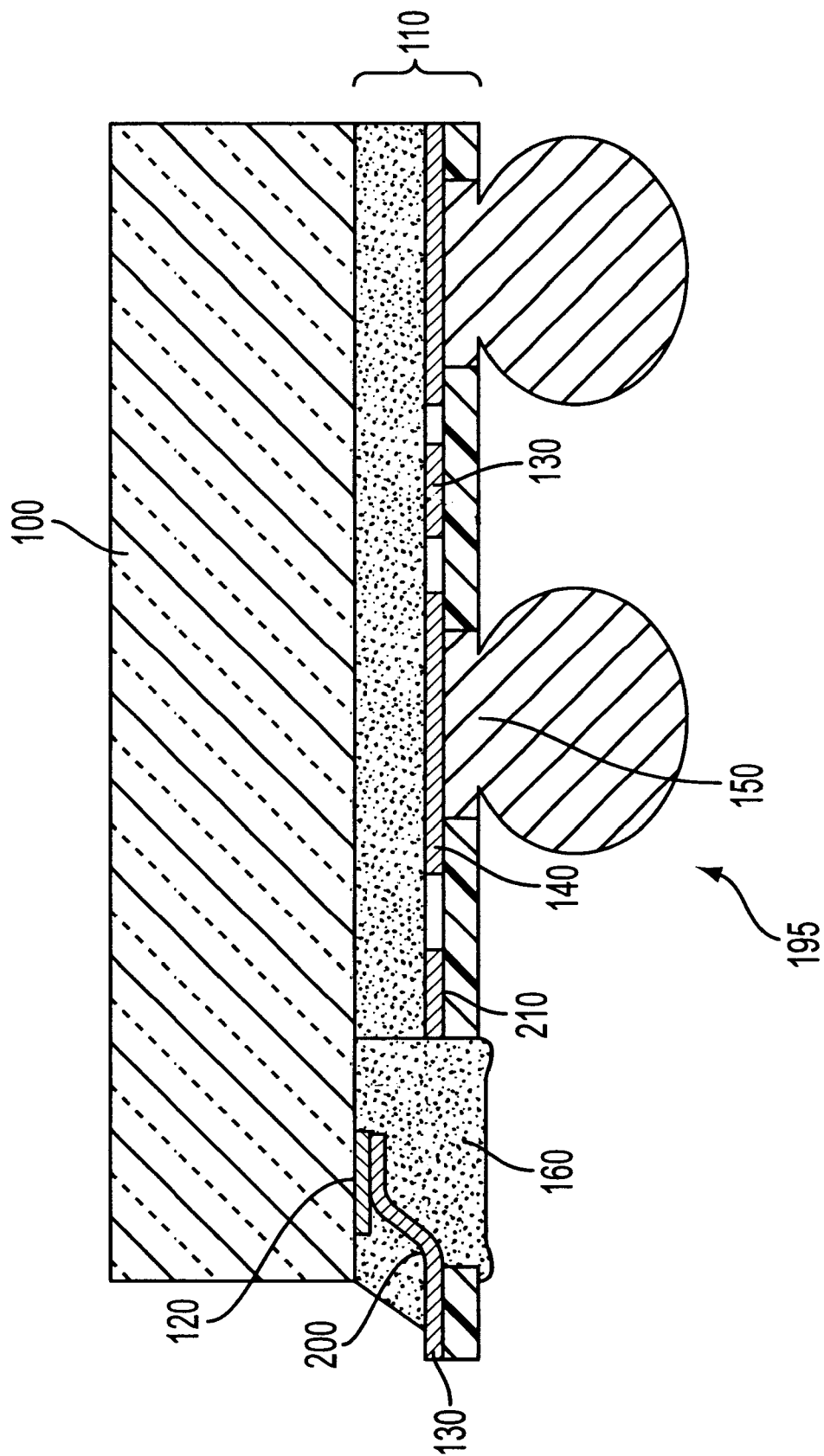
FIG. 4 is a side view of a micro-ball grid array ($\mu$BGA) package according to the invention taken along a cross-section IV—IV shown in FIG. 3.

FIGS. 3 and 4 depict views of a micro-ball grid array ($\mu$BGA) package according to the invention. Die 100, such as a FLASH memory die or other form of semiconductor chip, is disposed beneath substrate 110 in a die receiving section 115 depicted by a dashed line. Die 100 possesses a plurality of bonding pads 120 on a side of die 100 opposing the substrate 110. The substrate 110 is connected to die 100 by conventional connecting agents, such as an adhesive, which is preferably used in combination with a low-modulus compliant elastomer epoxy thermoset providing a buffer against, for example, displacements and stresses caused by varying coefficients of thermal expansion between the substrate 110 and die 100.

Substrate 110 is typically an organic high-modulus insulating film or tape, such as a polyimide film or other thermoset polymer commonly used in tape automated bonding (TAB). Examples of suitable tape include Kapton H™, Kapton V™ (both manufactured by DuPont), or a glass epoxy tape. Alternatively, the film may comprise a laminated structure including outer layers of a polyimide film or other thermoset polymer. It is preferred that the total thickness of the film be about 40–60 $\mu$m. Substrate 110 is rectangular or square in shape, often having a shape corresponding to that of die 100 and often being slightly larger than die 100 to provide, for example, additional space for routing of conductive traces 130 formed on or in the substrate to collectively form a wiring pattern.

The conductive traces 130 may be formed on the substrate by, for example, depositing a polyimide adhesive layer and then forming, such as by vapor deposition, a copper thin film thereon which is then selectively removed, such as by conventional photoetching techniques using etchants such as cupric chloride or ferric chloride. The present invention encompasses multiple levels of wiring in or on multiple sides of the substrate 110.

Windows or openings 160 are formed at positions corresponding to positions of the die 100 bonding pads 120 to permit connection of conductive elements 130 formed on or in the substrate 110 to these pads 120. These openings 160 may be formed, for example, by selectively etching exposed portions of the substrate 110 (e.g., sections where the copper film was etched to expose the tape) using an etchant such as a hydrazine-alkali aqueous solution. Opening 160 preferably has a width W between approximately 0.7 mm to 0.9 mm and it is generally preferred that the width be greater than or equal to 0.8 mm.

Each of the conductive or wire traces 130 has a land 140 at one end. In the illustrated embodiment, the land 140 is a substantially circular conductive pattern having a diameter slightly larger than a corresponding via 150 to be etched or formed thereover. Other shapes and sizes are provided in alternative embodiments. The vias 150 nominally have a diameter of between about 0.25 to 0.375 mm. Thus, the lands 140 must have at least a diameter accommodating the via 150 diameter and any possible via positioning tolerances. Thus, the lands 140 may range from approximately 0.30 to 0.50 mm, depending on via size, equipment and process tolerances, and other design considerations known to those skilled in the art. The lands 140 and vias 150 form a matrix, such as shown in FIG. 3, which may assume a variety of matrix-like forms and is not limited to any particular configuration. For example, although the pitch between the center lines of vias 150 in a μBGA (and hence balls formed therein) is maintained between about 0.40 to 0.80 mm the matrix may circumscribe only an outer boundary of a die 100 or substrate 110.

From lands 140, the traces 130 are routed along or within substrate 110 and are routed around other traces 130, lands 140 and vias 150 to terminate in the vicinity of substrate openings 160. In the conventional μBGA beam lead configuration, traces 130 are routed from the lands 140 to a position at opening 160 adjacent a respective bonding pad 120 in as short a distance as possible, as noted earlier as illustrated in FIG. 2. Thus, conventionally, traces 130 would approach openings 160 from only the "inside" of substrate 110. In other words, traces 130 would follow a path from a land 140 or via 150 within the matrix directly across the substrate 110 to approach the first side 170 of the nearest window 160 at a position corresponding to the nearest bonding pad 120. In contrast, the present invention includes at least one trace, and preferably a plurality of traces, routed from a land 140 or via 150 to a second side 180 of the opening 160 opposite the first side 170 of the opening. Alternately, one or more traces 130 could be routed from a land 140 or via 150 to a third side 190 of the opening 160 adjacent the first side 170 of the opening. The trace 130 routing may be provided only for lands 140 or vias 150 located adjacent respective openings 160 or may include lands 140 or vias 150 not disposed adjacent respective openings 160. In other words, the trace 130 routing may include not only the outer periphery of lands 140 and vias 150, but also lands and vias disposed within the matrix. As shown in FIG. 3, all of the traces 130 are routed to approach the windows or openings 160 from the "outside" or second side 180. This permits the lands 140 and vias 150 disposed adjacent the openings 160 to be placed closer to the openings 160 than would be permitted if the traces 130 were routed to approach the openings 160 from the "inside" or first side 170.

As formed or deposited, portions 200 of the traces 130 extend over positions corresponding to the openings 160 and to a position of a respective bonding pad 120. These portions 200 span the width of the area corresponding to the opening 160 and terminate in a tie bar or beam lead support 210. The tie bar 210 is typically common to each of the portions 200 for a particular opening, as shown in FIG. 3. To form the actual connections between the portion 200 or beam lead to the die bonding pad 120, the portion 200 is mechanically deformed to contact a respective bonding pad 120. This deformation and bonding may be achieved by conventional bonding techniques and tools, such as an ultrasonic wedge bonder or thermode, to form a beam lead connection. Portions 200 are preferably, but not necessarily, formed with a notch adjacent the tie bar 210. This notch slightly decreases the cross sectional area at the notched section, thereby creating a stress riser which facilitates separation of the beam lead 200 from the tie bar 210 at the notched section.

To permit electrical connection of the die 100 and substrate 110 product to, for example, a printed wiring board (PWB), conductive bumps or balls 195 are formed, in a manner known to those skilled in the art to fill the vias 150 and project above a surface of the substrate as shown in FIG. 4. Balls 195 are preferably solder balls, such as 63/37 or 60/40 PbSn, but may include other compositions and materials. For example, the balls could comprise 90/10 PbSn or conductive polymers or resins commonly known to those skilled in the art. Balls 195 preferably have a diameter of between approximately 0.30 to 0.35 mm and a height of about 0.22 to 0.24 mm above a surface of the substrate 110. Ball 195 dimensions and composition may be varied as necessary to accommodate particular applications.

Figure 5:
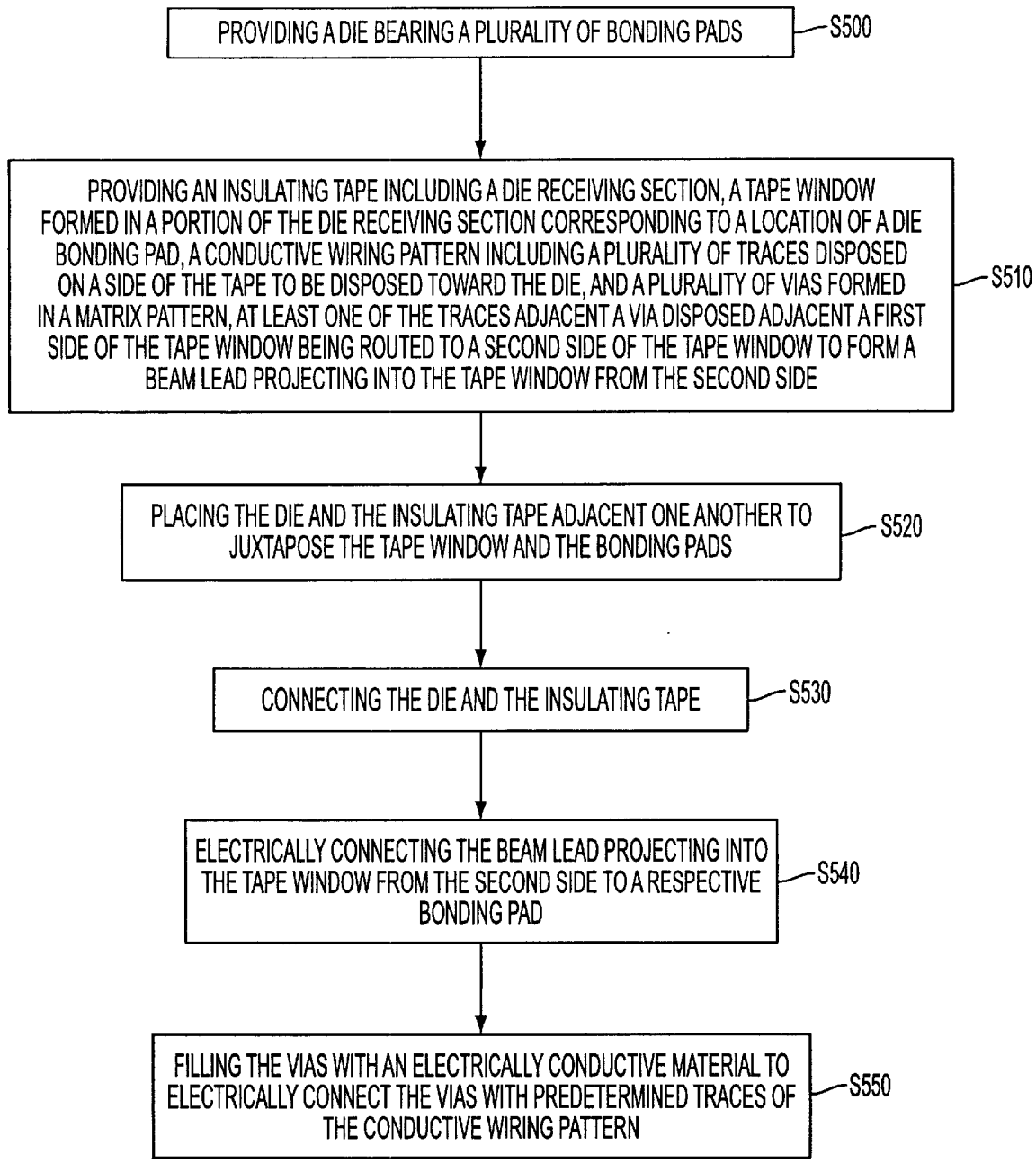
FIG. 5 is a flowchart illustrating a method for manufacturing a semiconductor package according to the invention.

FIG. 5 illustrates a method for manufacturing a semiconductor package according to the invention including providing, in steps S500 and S510, a die 100 bearing a plurality of bonding pads 120 and an insulating tape or substrate 110 including a die receiving section 115, as generally described above. According to the invention, the substrate 110 includes a tape window or opening 160 formed in a portion of the die receiving section 115 corresponding to a location of the die bonding pads 120 and conductive traces 130, at least one of which is routed from a land 140 or via 150 to a second side 180 of the tape window opposite the first side 170 or to a third side 190 adjacent the first side to form a beam lead projecting into the tape window from the respective second side or third side. In step S520, the die 100 and the substrate or tape 110 are placed adjacent one another to juxtapose the tape widow 160 and bonding pads 120. The die and insulating tape are then connected, such as by an adhesive, in step S530. Then, step S540 requires electrical connection of beam lead 200 projecting into the tape window 160 from the respective second side 180 or third side 190 to a respective bonding pad 120. Further, vias 150 may be filled with an electrically conductive material, such as solder balls 195, to electrically connect the vias with predetermined traces 130 of the conductive wiring pattern in step S550. These solder balls 195, preferably forming a ball grid array, may then be used to electrically connect the chip package to, for example, a printed circuit board (PCB).

Thus, the present invention addresses and solves problems related to μBGA reliability concerns stemming from disadvantageous bending profiles of the beam leads and inadequate trace length between the μBGA ball conductor and the beam lead by rerouting the wiring traces around the tape windows or bonding pad openings to approach the bonding pads from a side other than the side closest to the ball grid array. This permits the predetermined window size and predetermined beam lead length to be maintained, improving reliability and reducing manufacturing cost by permitting use of conventional equipment and technology.

Only several embodiments of the invention are shown to illustrate its versatility as shown and described in the present disclosure. As will be realized, the invention is capable of other and different embodiments, and its several details are capable of modifications in various obvious respects, all without departing from the invention and the drawings and description are to be regarded as illustrative in nature. Accordingly, the present invention is not limited by the specific aspects presented and described herein and is instead defined by the claims.

What is claimed is:

1. A semiconductor package, comprising:
   a die bearing a plurality of bonding pads;
   a substrate connected to the die by a connecting agent, the substrate including a plurality of conductive traces forming a wiring pattern, a plurality of vias forming a via matrix, and an opening defined by a plurality of lateral sides extending through said substrate at a position corresponding to said plurality of bonding pads; and
   a plurality of conductive elements filling the vias;
   wherein at least one trace electrically connected to a conductively filled via disposed closer to a first lateral side of the opening than a second lateral side of the opening is routed to the second lateral side of the opening to form a beam lead projecting into the opening from the second lateral side, and
   wherein the beam lead is electrically connected to one of the bonding pads.

2. A semiconductor package according to claim 1, wherein a plurality of traces electrically connected to conductively filled vias disposed adjacent a first lateral side of the opening are routed to the second lateral side of the opening to form a beam lead projecting into the opening from the second lateral side.

3. A semiconductor package according to claim 1, wherein traces electrically connected to conductively filled vias not disposed adjacent the first lateral side of the opening are routed to the second lateral side of the opening to form a beam lead projecting into the opening from the second lateral side.

4. A semiconductor package according to claim 2, wherein the second lateral side is opposite the first lateral side of the opening.

5. A semiconductor package according to claim 2, wherein the second lateral side is adjacent the first lateral side of the opening.

6. A semiconductor package according to claim 1, wherein the opening is disposed toward a periphery of the substrate to correspond to positions of die bonding pads.

7. A semiconductor package according to claim 1, wherein a portion of the substrate extends beyond a periphery of the die.

8. A semiconductor package according to claim 7, wherein traces routed to project into the opening from the second lateral side are routed through or on the portion of the substrate extending beyond the periphery of the die.

9. A semiconductor package according to claim 1, wherein a width of the opening is between approximately 0.7 mm to 0.9 mm.

10. A tape automated bonding (TAB) tape carrier, comprising:
    an insulating tape including a die receiving section;
    a tape window formed in a portion of the tape die receiving section corresponding to a location of a die bonding pad;
    a conductive wiring pattern including a plurality of traces; and
    a matrix of conductively filled vias electrically connecting a conductor filling the vias with predetermined traces of the conductive wiring pattern,
    wherein at least one trace electrically connected to a conductively filled via disposed adjacent a first lateral side of the opening is routed to a second lateral side of the opening to form a beam lead projecting into the tape window from the second lateral side, said beam lead spanning said tape window to connect to a tie bar adjacent a lateral side of the opening opposing said second lateral side.

11. A TAB tape carrier according to claim 10, wherein a plurality of traces electrically connected to conductively filled vias disposed adjacent a first lateral side of the tape window are routed to the second lateral side of the opening to form a beam lead projecting into the opening from the second lateral side.

12. A TAB tape carrier according to claim 10, wherein traces electrically connected to conductively filled vias not disposed adjacent a first lateral side of the tape window are routed to the second lateral side of the opening to form a beam lead projecting into the opening from the second lateral side.

13. A TAB tape carrier according to claim 10, wherein the second lateral side is opposite the first lateral side of the opening.

14. A TAB tape carrier according to claim 10, wherein the second lateral side is adjacent the first lateral side of the opening.

15. A TAB tape carrier according to claim 10, wherein a portion of the substrate extends beyond a periphery of the die.

16. A TAB tape carrier according to claim 15, wherein traces routed to project into the tape window from the second lateral side or third lateral side are routed through or on the portion of the substrate extending beyond the periphery of the die.

17. A TAB tape carrier according to claim 9, wherein a width of the window is between approximately 0.7 mm to 0.9 mm.

* * * * *